US011856730B2

(12) United States Patent
Ge et al.

(10) Patent No.: US 11,856,730 B2
(45) Date of Patent: Dec. 26, 2023

(54) LIQUID-COOLED INTEGRATED CABINET

(71) Applicant: CMOTION TECHNOLOGIES LIMITED, HongKong (CN)

(72) Inventors: Changjiang Ge, Beijing (CN); Minghui Sun, Beijing (CN); Hao Peng, Beijing (CN); Bin Yang, Beijing (CN); Zhenhui Li, Beijing (CN)

(73) Assignee: CMOTION TECHNOLOGIES LIMITED, Hongkong (CN)

( * ) Notice: Subject to any disclaimer, the term of this patent is extended or adjusted under 35 U.S.C. 154(b) by 102 days.

(21) Appl. No.: 17/467,284

(22) Filed: Sep. 6, 2021

(65) Prior Publication Data

US 2022/0141999 A1    May 5, 2022

(30) Foreign Application Priority Data

Nov. 3, 2020  (CN) .......................... 202011211326.0
Nov. 3, 2020  (CN) .......................... 202022504714.X

(51) Int. Cl.
*H05K 7/20*    (2006.01)

(52) U.S. Cl.
CPC ..... *H05K 7/20272* (2013.01); *H05K 7/20254* (2013.01); *H05K 7/20718* (2013.01); *H05K 7/20781* (2013.01)

(58) Field of Classification Search
CPC .......................... H05K 7/20718–20736; H05K 7/20763–20781; H05K 7/20272; H05K 7/20254
See application file for complete search history.

(56) References Cited

U.S. PATENT DOCUMENTS 8,520,387 B2 *  8/2013  Chen .................. H05K 7/20736
                                        361/679.48
8,654,532 B2 *  2/2014  Chen .................. H05K 7/20781
                                        361/689

(Continued)

FOREIGN PATENT DOCUMENTS

CN           207040117 U  *  2/2018

*Primary Examiner* — Zachary Pape
(74) *Attorney, Agent, or Firm* — Andrew C. Cheng

(57) ABSTRACT

The present invention provides a liquid-cooled integrated cabinet, which belongs to the technical field of servers, and comprises a main body. A power distribution module is provided at the upper end of the main body, and multiple computing power modules which constitute a computing power center are parallelly provided on one side of the lower end of the main body; cooling fans stacked on top and bottom in multiple layers are arranged on the other side thereof; the computing power module is cooled by a liquid-cooled module, and the liquid-cooled module is a front and rear drawing structure relative to the main body. The cooling fan bears 8%-12% of the heat dissipation capacity. A cold plate shell in the liquid-cooled module contacts and conducts heat with a chip in the computing power module. The front end of the main body is provided with a hose for cooling medium to circulate; a liquid-cooled module corresponds to a hose; cooling medium flows through the hose and the liquid-cooled module, and then cools down the computing power module. The liquid-cooled integrated cabinet of the present invention is high in heat dissipation efficiency and compact in structure.

10 Claims, 5 Drawing Sheets

(56) References Cited

U.S. PATENT DOCUMENTS

2016/0120059 A1* 4/2016 Shedd ................ F28D 21/00
                                                    165/244
2016/0353613 A1* 12/2016 Chen ................ H05K 7/20781
2017/0142867 A1* 5/2017 Xu ................ H05K 7/1488

* cited by examiner

LIQUID-COOLED INTEGRATED CABINET

FIELD OF THE INVENTION

The present invention belongs to the field of servers, and relates to cooled equipment and technology of server cabinets, in particular to a liquid-cooled integrated cabinet.

BACKGROUND OF THE INVENTION

A server is a type of computers, which runs faster, has a higher load, and is more expensive than an ordinary computer. The server provides calculation or application services for other clients (such as terminals of PCs, smart phones, ATMs, etc. and even large equipments such as train systems) in a network. The server has high-speed CPU computing power, long-term reliable operation, strong I/O external data throughput and good scalability. According to the services provided by the server, generally speaking, the server has the capacities of responding to service requests and undertaking service and guaranteeing service. Currently, server cabinets on the market are mainly air-cooled. Air enters the server after being cooled by an air conditioner, exchanges heat with a internal radiator of the server, and then is discharged outside the cabinet. A common bitcoin mining machine is a type of servers. In the work space, the indoor temperature can still reach as high as 40 degrees although an air conditioner is arranged. The strong wind formed by draught fans makes it impossible for people to move forward, and there are uncountable mining machines behind these draught fans, which often runs continuously for 24 hours and consumes a lot of power. In order to ensure normal operation, it is necessary to quickly solve the problem of temperature reduction.

Currently, air-cooled server cabinets on the market have the following shortcomings: 1. The power density of a single cabinet is low, the highest power density thereof is about 20 KW. 2. The power consumption is large, and the energy consumption of an air compressor is high. 3. The noise is large. The air passing through the cabinet is driven by a plurality of high-power fans, and the noise of the fans is large. 4. It occupies a large area. Usually, a single air-cooled cabinet is equipped with an inter-row air-conditioner cabinet. Existing servers mainly use an air-conditioner to cool the air and then cool down. If a single standard cabinet meets the cooling requirements, the maximum heat generation can not exceed 20 KW. The cooling method of the cabinet is as follows: cold air flows through the front of the cabinet and enters the module; the cold air exchanges heat with the heat sink inside the module; the cold air is heated and driven out of the cabinet by the fan, and the hot air enters the cabinet again after being cooled by external air conditioner; the above is cycled in turn.

SUMMARY OF THE INVENTION

The problem solved by the present invention is to provide a liquid-cooled container equipment with high heat dissipation efficiency, wherein the heat dissipation capacity of a single cabinet can reach 80 KW. Compared with compressor refrigeration, in the structure of the present application, cooling liquid flows through a cold plate shell inside the liquid-cooled module. The cold plate shell contacts and conducts heat with a chip in the computing power module, omitting the intermediate air compression link and is more energy-efficient.

In order to solve the above technical problems, the present invention is achieved by the following technical solutions: a liquid-cooled integrated cabinet comprises a main body; a power distribution module is provided at the upper end of the main body, and multiple computing power modules which constitute a computing power center are parallelly provided on one side of the lower end of the main body; cooling fans stacked on top and bottom in multiple layers are arranged on the other side thereof; the computing power module is cooled by a liquid-cooled module, and the liquid-cooled module is a front and rear drawing structure relative to the main body;

the cooling fan bears 8%-12% of the heat dissipation capacity;

a cold plate shell in the liquid-cooled module contacts and conducts heat with a chip in the computing power module;

the front end of the main body is provided with a hose for cooling medium to circulate; a liquid-cooled module corresponds to a hose; cooling medium flows through the hose and the liquid-cooled module, and then cools down the computing power module.

Furthermore, the front end of each liquid-cooled module is provided with a handle which is convenient for pushing and pulling; the liquid-cooled module is a blade type liquid-cooled module.

Furthermore, one side of the front end of the main body is provided with a first main water pipe, and the opposite side thereof is provided with a second main water pipe; the first main water pipe is provided with a plurality of parallel hoses; one end of the hose is connected to the first main water pipe; the opposite end thereof enters the liquid-cooled module, then passes through the side of the liquid-cooled module away from the first main water pipe and then is connected to the second main water pipe; a liquid-cooled module corresponds to a hose; cooling medium flows through the hose and the liquid-cooled module, and then cools down the computing power module.

Furthermore, the first main water pipe and the second main water pipe are both vertically arranged; the lower ends thereof are arc-shaped; the first main water pipe and the second main water pipe are connected with a drain valve respectively; the drain valve extends horizontally toward the front end of the main body, and the upper connecting port of the first main water pipe and the upper connecting port of the second main water pipe are arranged horizontally.

Furthermore, a plurality of the hoses are connected in parallel with the first main water pipe, and the hoses are arranged in parallel up and down; a first valve for controlling on-off of the hose is provided between the hose and the first main water pipe; a second valve for controlling on-off of the hose is provided between the hose and the second main water pipe, and the hose is connected with the liquid-cooled module through a quick-plug connector.

Furthermore, the hose extends from the first main water pipe to a direction away from the main body, and then enters the liquid-cooled module after forming a first arch, and the cooling fan is arranged in the area of the first arch; the hose forms a second arch after passing through the liquid-cooled module and then enters the second main water pipe; the first valve is at the position of the straight line section of the first arch, and the second valve is at the position of the straight line section of the second arch; and one of the first main water pipe and the second main water pipe is used as a water inlet pipe, and the other thereof is used as a water outlet pipe.

Furthermore, the structure of the first valve is the same as that of the second valve; the upper end of the first valve is provided with a driving handle, and the driving handle is a fan-type structure and comprises four vertical and uniformly arranged L-shaped sheet metals.

Furthermore, the material of the hose comprises but is not limited to the following: hydrogenated nitrile rubber, low temperature resistant fluoro rubber, low phenyl silicone rubber, silicone rubber, fluorosilicone rubber, FEP tube, FPA tube, Teflon tube or Nylon tube.

Furthermore, the inner diameter of the first main water pipe is the same as that of the second main water pipe, and the inner diameter of the hose is less than ⅓ of the inner diameter of the first main water pipe.

Furthermore, the main body is an assembled frame structure.

Compared with the prior art, the present invention has the following advantages and positive effects that:

1. The first main water pipe, the second main water pipe and the hose of the present invention are arranged in front of the main body, so as to be convenient for maintenance and repair which is carried out from the front of the main body uniformly, and be easy to install the whole structure against the wall, resulting in occupying a small space. Medium circulates from the hose and are cooled through the liquid-cooled module, so as to realize a liquid cooling mode, namely a cold plate shell inside the liquid-cooled module contacts and conducts heat with a chip in the computing power module, greatly improving heat dissipation efficiency.
2. The present invention adopts a liquid cooling mode to cool, only about 10% of remaining heat needs to be taken away by the cooling fan, greatly reducing the noise of the cooling fan. The cooling medium in the hose is water or a low-temperature resistant antifreeze, which is specifically selected based on the local lowest temperature in winter, so as to prevent internal pipeline coolant inside the equipment from freezing resulting in cracking the pipeline.
3. The present invention is provided with a drain valve. When the valve connecting the inlet and outlet main pipes of the cabinet with the outside is closed, and the water in the cabinet can be completely drained from top to bottom, which facilitates the draining of all the cooling liquid in the cabinet during the maintenance, thereby improving the convenience of the maintenance.
4. Each layer of the liquid-cooled module in the present application is arranged independently. Close the first valve and the second valve on the front-rear influent and effluent water hose of the corresponding blade type liquid-cooled module, disassemble a quick-plug connector connected with the hose, and pull out the blade type liquid-cooled module to be repaired. The blade type liquid-cooled module can be installed in the opposite direction to the above processes. The maintenance of the blade type liquid-cooled module is swift and convenient. A two-way cut-off quick-plug connector can be adopted directly to replace the first valve and the second valve, making it faster to disassemble.

BRIEF DESCRIPTION OF THE DRAWINGS

The drawings constituting a part of the present invention are used to provide a further understanding of the present invention, and the exemplary embodiments of the present invention and the description thereof are used to explain the present invention, and do not constitute an improper limitation of the present invention. In the drawings.

Figure 1:
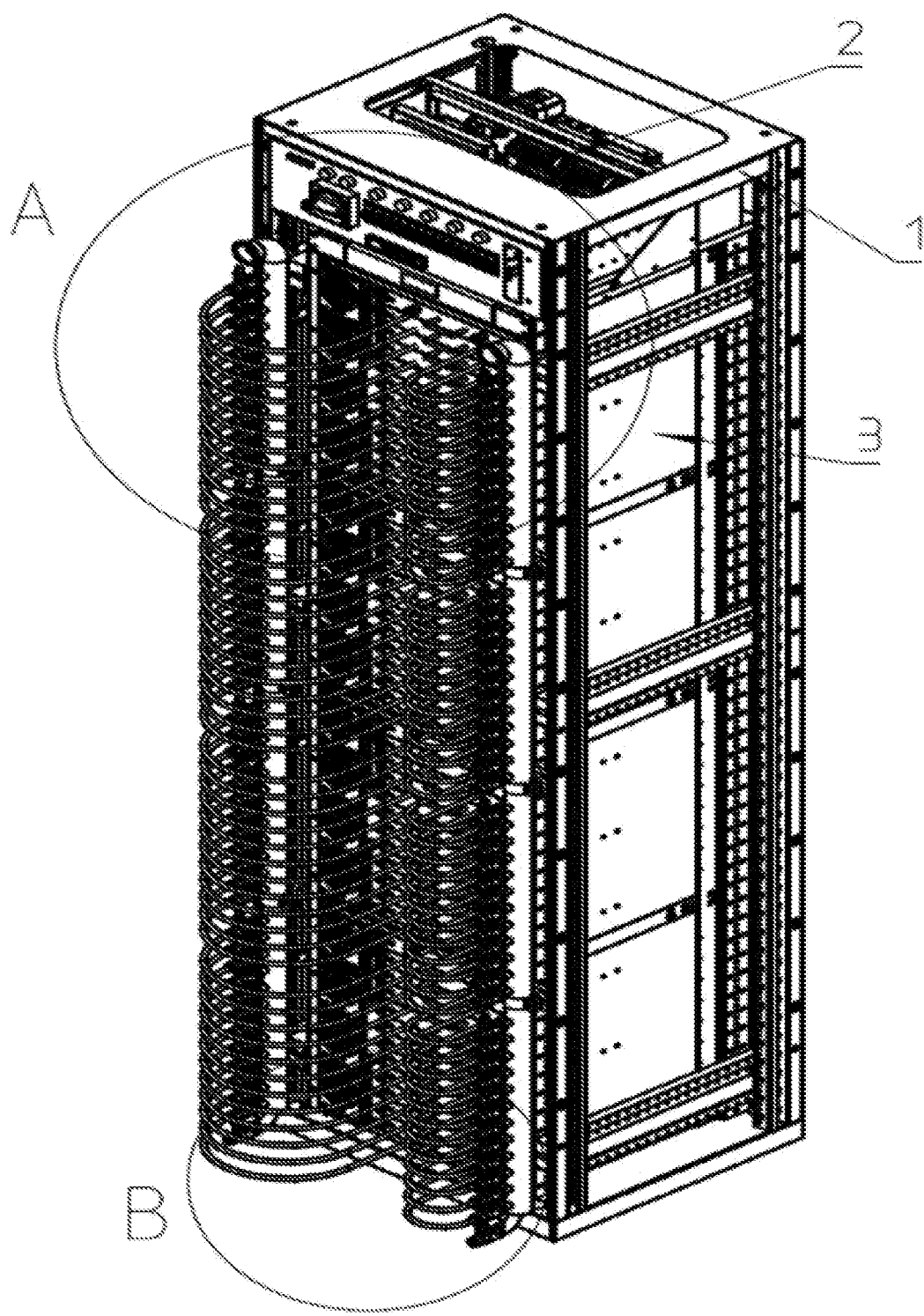
FIG. 1 is a schematic structural view of a liquid-cooled integrated cabinet in the present invention.
Figure 2:
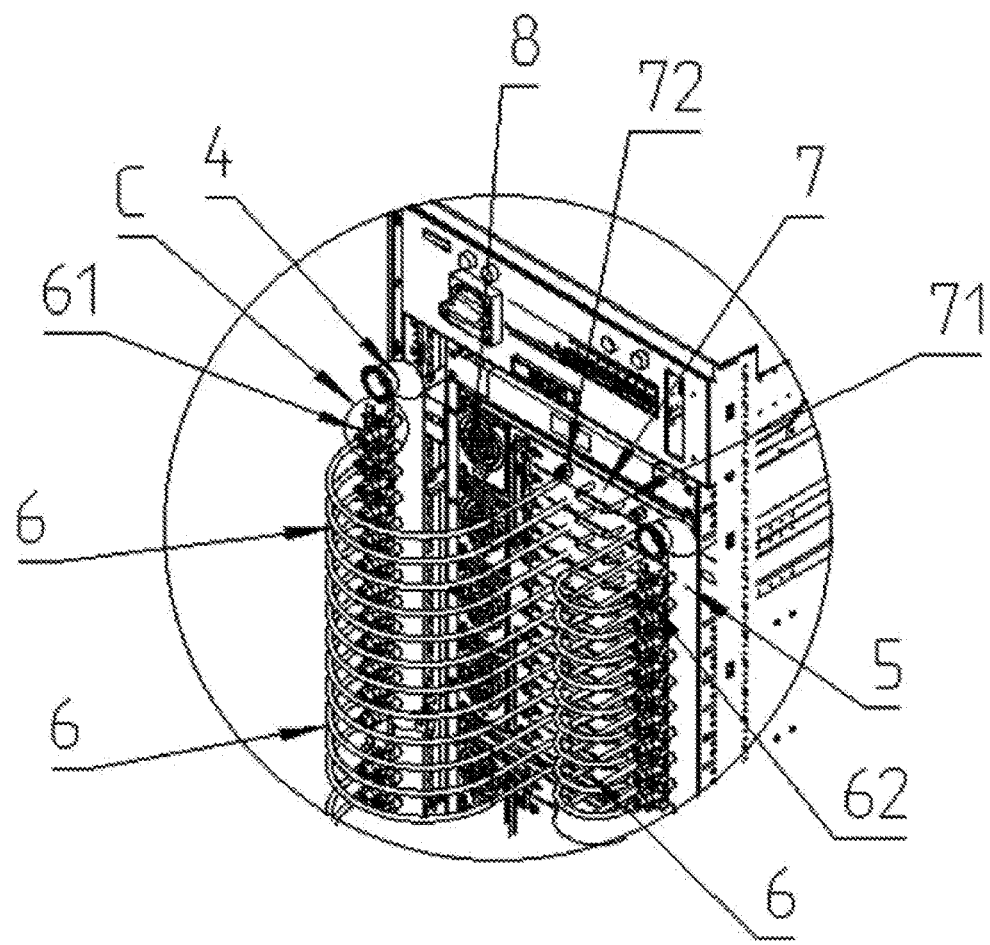
FIG. 2 is a detailed view of part A of FIG. 1 in the present invention.
Figure 3:
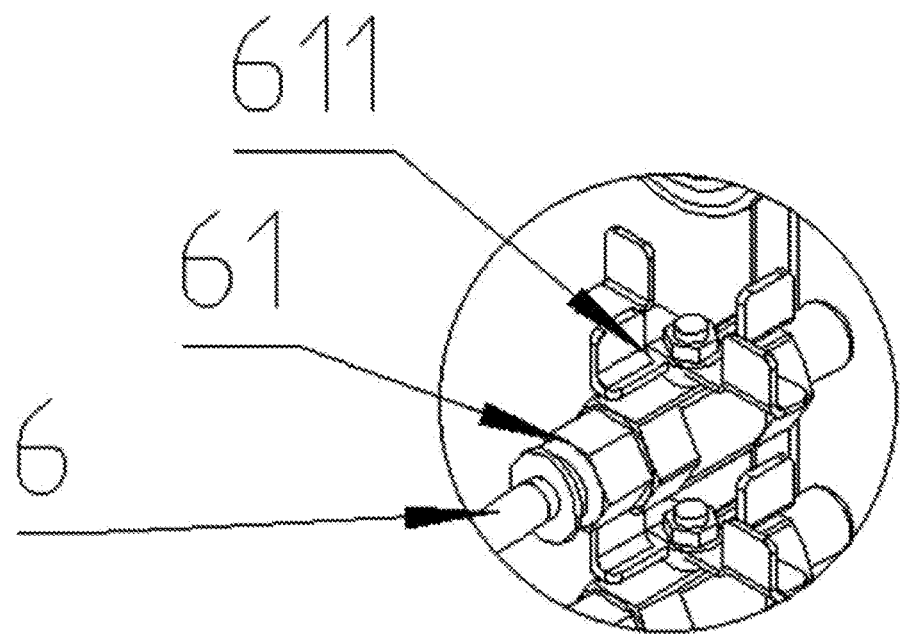
FIG. 3 is a detailed view of part C of FIG. 2 in the present invention.
Figure 4:
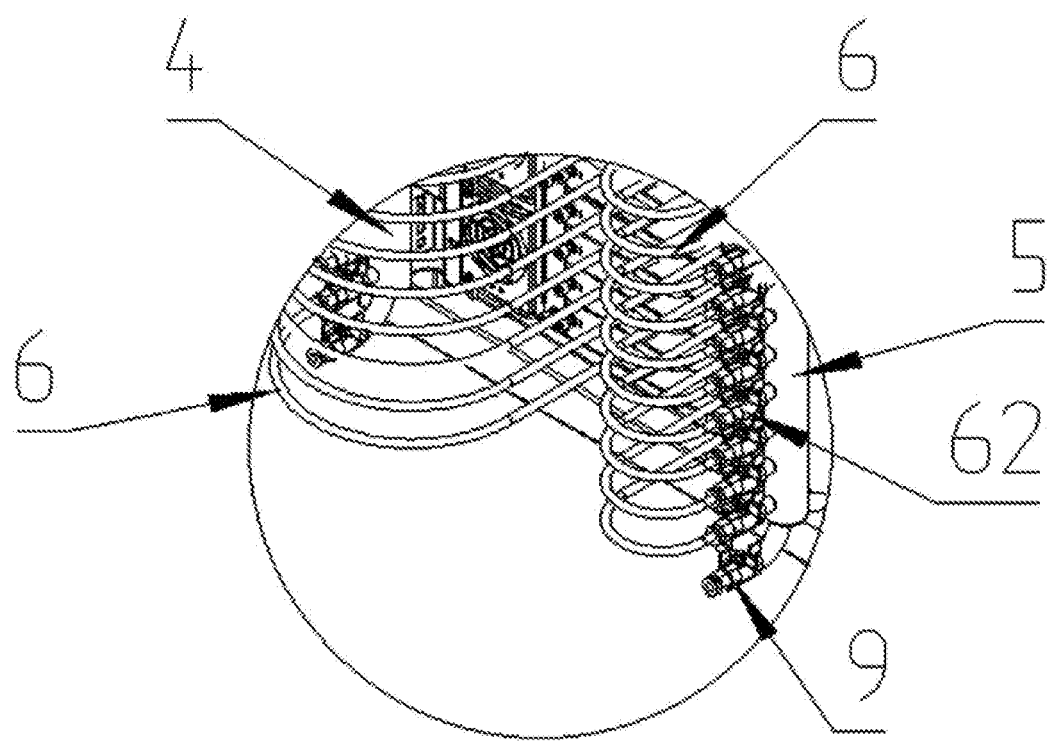
FIG. 4 is a detailed view of part B of FIG. 1 in the present invention.
Figure 5:
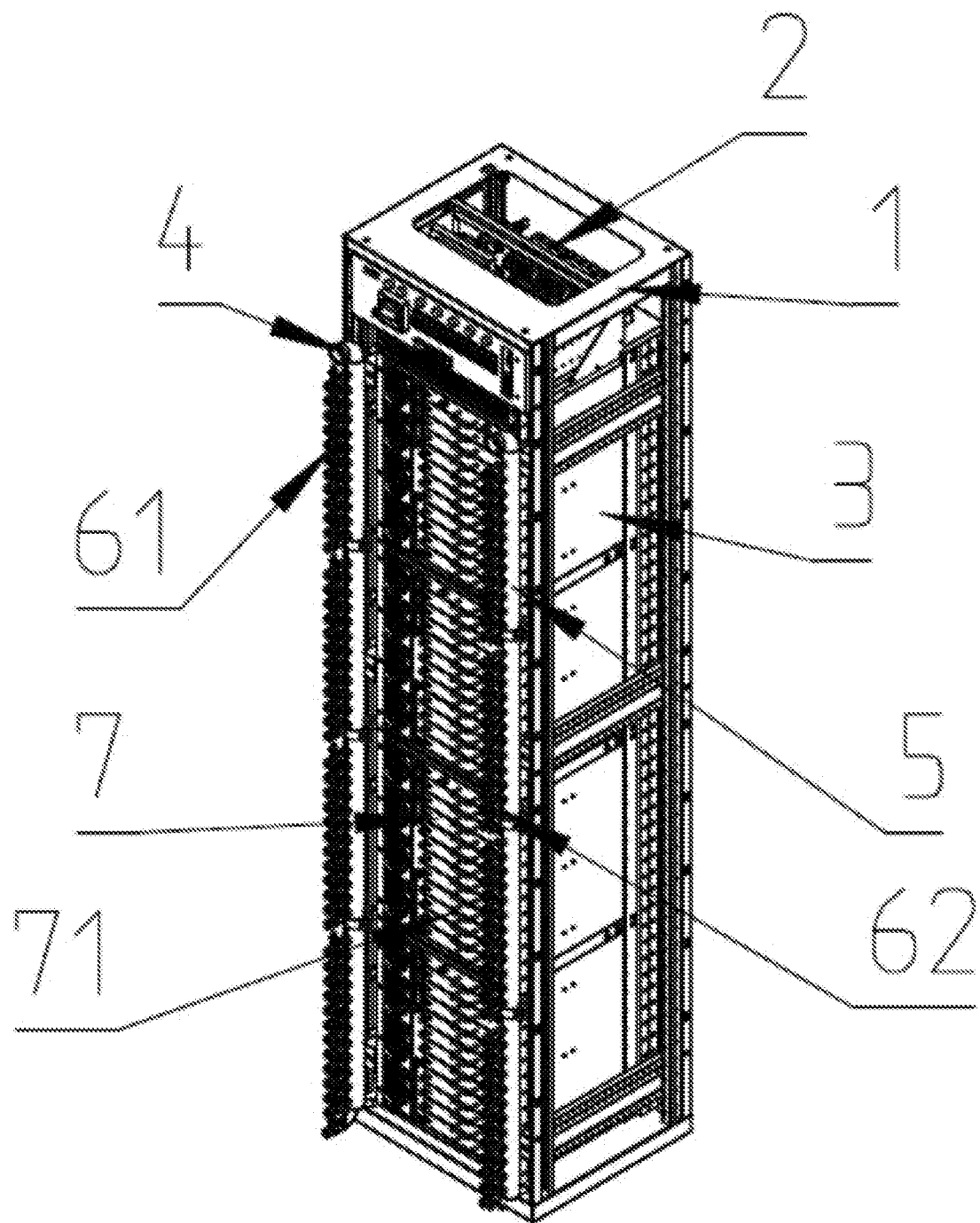
FIG. 5 is a schematic structural view of a cabinet without a hose in the present invention.

DESCRIPTION OF THE DRAWINGS 1. main body; 2. power distribution module; 3. computing power module; 4. first main water pipe; 5. second main water pipe; 6. hose; 61. first valve; 611. driving handle; 62. second valve; 7. liquid-cooled module; 71. handle; 72. quick-plug connector; 8. cooling fan; 9. drain valve.

DETAILED DESCRIPTION OF THE PREFERRED EMBODIMENTS

It should be noted that embodiments of the present invention and features in the embodiments can be combined with each other without conflict.

In the description of the present invention, it should be understood that the terms "center", "longitudinal", "lateral", "up", "down", "front", "rear", "left", "right", "vertical", "horizontal", "top", "bottom", "inner", "outer", etc. indicating orientations or positional relationships is based on those shown in the drawings and are used only for convenience in describing the present invention and for simplicity in description rather than indicating or implying that the referenced devices or elements must have a particular orientation, and be constructed and operated in a particular orientation, and therefore cannot be understood as limiting the present invention.

Furthermore, the terms "first", "second", etc. are only used for descriptive purposes only and cannot be understood as indicating or implying relative importance or implicitly indicating the number of indicated technical features. Thus, a feature defined as "first", "second," etc. may explicitly or implicitly include one or more of the feature. In the description of the present invention, "plurality" means two or more unless otherwise specified.

In the description of the present invention, it should be noted that, unless otherwise explicitly specified and limited, the terms "installation", "connection" and "communication" should be understood in a broad sense, for example, it can be a fixed connection, a detachable connection or an integral connection; it can be a mechanical connection or an electrical connection; it can be directly connected or indirectly connected through an intermediate medium, and it can be the internal communication between two components. The specific meaning of the above terms in the present invention can be understood by those of ordinary skill in the art through specific situations.

Below, the specific embodiments of the present invention will be described in detail with reference to the drawings.

Bitcoin is a virtual encrypted digital currency in the form of P2P. Peer-to-peer transmission means a decentralized payment system. Unlike all currencies, the bitcoin is generated by a large number of calculations according to a specific algorithm, not relying on a specific currency institution to issue. Bitcoin economy uses a distributed database composed of many nodes in the entire P2P network to confirm and record all transaction behaviors, and uses a cryptographic design to ensure the security of all links of currency circulation. The decentralized nature of P2P and the algorithm itself can ensure that the value of the currency cannot be manipulated through the large-scale production of the bitcoin. The design based on cryptography allows the bitcoin to be transferred or paid only by the real owner.

The essence of the bitcoin is actually a special solution generated by a bunch of complex algorithms. A special solution refers to a set of finite solutions available to a system of equations, and each special solution is unique and capable of solving an equation. Compared with the banknotes, the bitcoin is similar to the serial number of a banknote. If the serial number on a certain banknote is known, the banknote will be owned. The process of mining is to constantly seek the special solution of the equations through a huge amount of calculation. The equations is designed to have only 21 million special solutions, so the upper limit of the bitcoin is 21 million.

Computing power (also known as hash rate) is a measure of the processing power of a bitcoin network, that is to say the speed at which the computer (CPU) calculates the output of the hash function. A bitcoin network must perform intensive mathematical and encryption related operations for security purposes. For example, when the network reaches a hash rate of 10 Th/s, it means that it can perform 10 trillion calculations per second.

In the process of obtaining bitcoin through "mining", we need to find its corresponding solution m. And for any 64-bit hash value, there is no fixed algorithm to find its solution m, and it can only depend on random hash collisions of the computer. How many hash collisions a mining machine can make per second, is the representative of its "computing power", and the unit thereof is hash/s, which is the so-called proof of work mechanism POW (Proof Of Work). The computing power is used to measure the total computing power of a unit that generates a new block under a certain network consumption. A single blockchain of each coin changes with the time required to generate a new transaction block.

As shown in FIG. 1 to FIG. 5, a liquid-cooled integrated cabinet of the present invention, comprises a main body 1. A power distribution module 2 is provided at the upper end of the main body 1, and multiple computing power modules 3 are parallelly provided on one side of the lower end of the main body 1. The multiple computing power modules 3 constitute a computing power center. Cooling fans 8 stacked on top and bottom in multiple layers are arranged on the other side of the lower end of the main body 1. The computing power module 3 is cooled by a liquid-cooled module 7. The liquid-cooled module 7 is a front and rear drawing structure relative to the main body 1. The computing power module and the liquid-cooled module are conventional modules in the market, and can be a liquid-cooled mode according to the structure of the application.

One side of the front end of the main body 1 is provided with a first main water pipe 4, and the opposite side thereof is provided with a second main water pipe 5. The first main water pipe 4 is provided with a plurality of parallel hoses 6. One end of the hose 6 is connected to the first main water pipe 4, the opposite end thereof enters the liquid-cooled module 7, then passes through the side of the liquid-cooled module 7 away from the first main water pipe 4 and then is connected to the second main water pipe 5. A liquid-cooled module 7 corresponds to a hose 6, and cooling medium flows through the hose 6 and the liquid-cooled module 7, and then cools down the computing power module 3, thereby realizing liquid cooling requirement.

Figure 6:
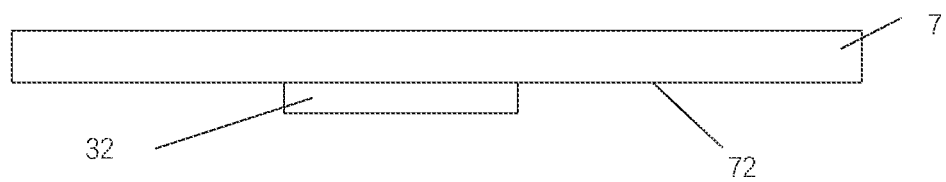
FIG. 6 illustrates a cold plate shell in the liquid-cooled module thermally contacting with the chip in the computing power module.

Preferably, the front end of each liquid-cooled module 7 is provided with a handle 71 which is convenient for pushing, pulling and repairing, does not affect the work of other liquid-cooled modules 7 during the repair process and has strong independence. The liquid-cooled module 7 is a blade type liquid-cooled module 7, and a cold plate shell 72 in the liquid-cooled module 7 thermally contacts with the chip 32 in the computing power module 3 as shown in FIG. 6.

Preferably, the first main water pipe 4 and the second main water pipe 5 are both vertically arranged, and the lower ends thereof are both arc-shaped. The first main water pipe 4 and the second main water pipe 5 are connected with a drain valve 9 respectively. The drain valve 9 extends horizontally toward the front end of the main body 1. The upper connecting port of the first main water pipe 4 and the upper connecting port of the second main water pipe 5 are arranged horizontally. The horizontally arranged structure facilitates the installation and connection of pipelines, and the pipelines can be directly installed horizontally, so as to reduce the operation in the vertical direction and improves work efficiency. The above structure can also be carried out in other directions which can realize the structure of this application.

Preferably, a plurality of the hoses 6 are connected in parallel with the first main water pipe 4. The hoses 6 are arranged in parallel up and down. A first valve 61 which controls on-off of the hose 6 is provided between the hose 6 and the first main water pipe 4. A second valve 62 which controls on-off of the hose 6 is provided between the hose 6 and the second main water pipe 5. The hose 6 is connected with the liquid-cooled module 7 through a quick-plug connector 72, which is convenient and quick to connect. And the quick-plug connector 72 is a commonly used connector in the market and the specification thereof is various, which can meet the matching requirements of various specifications of hoses 6. And the first hose 6 and the second hose 6 are set at the same time, and the software of the same layer is controlled, which is convenient to operate the independent liquid-cooled module 7 and is highly independent of each other.

Preferably, the hose 6 extends from the first main water pipe 4 to a direction away from the main body 1, and then enters the liquid-cooled module 7 after forming a first arch. The cooling fan 8 is arranged in the area of the first arch. The hose 6 forms a second arch after passing through the liquid-cooled module 7 and then enters the second main water pipe 5. The first valve 61 is at the position of the straight line section of the first arch, the second valve 62 is at the position of the straight line section of the second arch. One of the first main water pipe 4 and the second main water pipe 5 is used as a water inlet pipe, and the other thereof is used as a water outlet pipe. The hose 6 is arranged at the front end of the main body 1. Thus, the internal space of the cabinet is not occupied, and pipeline replacement is convenient. The computing power module 3 is installed and maintained at the front, omitting the need for operating space at the back of the cabinet. Moreover, after adopting this structure, it can be installed against a wall, which occupies a smaller space, has a more compact structure, and is convenient for maintenance.

Preferably, the structure of the first valve 61 is the same as the structure of the second valve 62. The upper end of the first valve 61 is provided with a driving handle 611. The driving handle 611 is a fan-type structure and includes four vertical and uniformly arranged L-shaped sheet metals, so that it is convenient to adjust the position of the driving handle. After inserting the rod-shaped structure matching with two of the L-shaped sheet metals, the handle 611 can be driven to rotate, thereby completing the rotation of the first valve 61 or the second valve 62 and adjusting the flow rate of the cooling medium.

Preferably, the material of the hose 6 includes but is not limited to the following, hydrogenated nitrile rubber, low temperature resistant fluoro rubber, low phenyl silicone rubber, silicone rubber, fluorosilicone rubber, FEP tube, FPA tube, Teflon tube or Nylon tube, as long as the hose 6 can withstand a certain low temperature, has stable chemical properties, and can be purchased directly from the market. The inner diameter of the first main water pipe 4 is the same as the second main water pipe 5, ensuring the same influent and effluent water quantity, not easy to appear the condition of medium disorder, and having stable dimension and good cooling effect. The inner diameter of the hose 6 is less than ⅓ of the inner diameter of the first main water pipe 4, ensuring that the first main water pipe 4 or the second main water pipe 5 supplies a plurality of the hoses 6 to medium.

Preferably, cooling medium in the hose 6 is water or a low-temperature resistant antifreeze, which is specifically selected based on the lowest local temperature in winter, so as to prevent the internal pipeline coolant inside the equipment from freezing resulting in cracking the pipeline.

Preferably, the cooling fan 8 bears 8%-12% of the heat dissipation capacity, and the remaining heat is cooled by liquid-cooled mode. Combination of the two greatly reduces the noise of air cooling.

Preferably, the main body is an assembled frame structure with low cost and high strength.

In the actual use process, this application mainly uses air conditioners to cool down air and then cool a existing server. If a single standard cabinet meets the cooling requirement, the maximum heat generation cannot exceed 20 KW. In this application, the cooling liquid can be directly used to enter a liquid cooling heating inside the server. Namely a cold plate shell in the liquid-cooled module contacts and conducts heat with a chip in the computing power module, greatly improving heat dissipation efficiency.

The cooling liquid enters from the first main water pipe 4 on the main body 1, and then diverted to the inside of the blade type liquid-cooled module 7 through the hose 6. The liquid-cooled module 7 includes a liquid-cooled plate on which a pipeline for supplying cooling medium is provided. The circulating cooling medium cools the heating chip. The cooling liquid is heated, then flows through the hose 6 and converges on the second main water pipe 5, and finally flows through the upper end of the second main water pipe 5 and is discharged out of the cabinet. The remaining heat inside the blade type liquid-cooled module 7 exits the cabinet by a cooling fan 8 provided on the main body 1. In this application, the medium can also enter from the second main water pipe 5 and exit from the first main water pipe 4. There is no restriction of the direction, as long as there is a process of medium circulation, all solutions can play the effect of cooling.

The blade type liquid-cooed modules 7 are all independent. The maintenance process thereof is to close the first valve 61 and the second valve 62 on the front and rear influent and effluent water hoses 6 of the corresponding blade type liquid-cooled module 7, disassemble a quick-plug connector 72 connected with the hose 6, pull out the hose, drain the cooling liquid, and pull out the blade type liquid-cooled module to be repaired. The blade type liquid-cooled module can be installed in the opposite direction to the above processes. The maintenance of the blade type liquid-cooled module is swift, convenient and low cost. In this application, the first valve and the second valve can also be replaced by two-way cut-off quick-plug connector. In the scheme of the two-way cut-off quick-plug connector, the hose and the module do not need to be disassembled, and can be transported, maintained and installed as a whole, which is more convenient. In this application, manual valves can also be used, or other valves with on-off functions or other equivalent structures can achieve the functions in the application.

If the entire cabinet needs to be drained and repaired, it is necessary to close the inlet and outlet valves of two main water pipes connected with external water system, so as to ensure that the water flow between the main water pipe and a external pipe is disconnected. And open the drain valve 9 at the bottom of the first main water pipe 4 and the second main water pipe 5. That is, close and disassemble the drain valve 9 that connects the cabinet and outside pipeline, and all the water inside the cabinet can be drained from top to bottom, which is convenient for draining all the cooling liquid in the cabinet during maintenance.

The overall depth of the application is about 500-600 mm, and the depth is relatively shallow. The application is suitable for bitcoin mining and has high heat dissipation efficiency. A single cabinet can reach 80 KW heat dissipation. Compared with compressor refrigeration, the cold plate shell and a chip in the computing power module 3 is contacts and conducts heat with a chip in the computing power module, which omits the intermediate air compression link and is more energy-efficient. The air-cooled server relies on a fan with large air volume to reduce the temperature of the chip, the liquid-cooled mode is adopted for cooling in this application, only about 10% of the remaining heat needs to be taken by a cooling fan 8, the noise of the cooling fan 8 is greatly reduced due to the reduction of the air speed of the cooling fan 8. The cooling medium in the hose is water or a low-temperature resistant antifreeze, which is specifically selected based on the local lowest temperature in winter, so as to prevent internal pipeline coolant inside the equipment from freezing resulting in cracking the pipeline.

An embodiment of the present invention has been described in detail above, but the content is only a preferred embodiment of the present invention and cannot be considered as limiting the implementation scope of the present invention. All equal changes and improvements, etc made in accordance with the application scope of the present invention shall also fall within the scope of the present invention.

The invention claimed is:

1. A liquid-cooled integrated cabinet, wherein the liquid-cooled integrated cabinet comprises a main body; a power distribution module is provided at an upper end of the main body, and multiple computing power modules which constitute a computing power center are parallelly provided on one side of the lower end of the main body; cooling fans stacked on top and bottom in multiple layers are arranged on another side of the lower end of the main body; each of the multiple computing power modules is cooled by a respective liquid-cooled module, and each liquid-cooled module is detachable from or attachable to the main body in a front-and-rear direction;

the cooling fans bear 8%-12% of the heat dissipation capacity;

a cold plate shell in each liquid-cooled module thermally contacts with a chip in the computing power module;

a front end of the main body is provided with multiple hoses for cooling medium to circulate; each liquid-cooled module corresponds to a respective hose; cooling medium flows through the respective hose and the respective liquid-cooled module, and then cools down the respective computing power module.

2. The liquid-cooled integrated cabinet of claim 1, wherein a front end of each liquid-cooled module is provided with a handle which is convenient for pushing and pulling, the liquid-cooled module is a blade type liquid-cooled module.

3. The liquid-cooled integrated cabinet of claim 1, wherein one side of the front end of the main body is provided with a first main water pipe, and the opposite side thereof is provided with a second main water pipe; the first main water pipe is provided with a plurality of parallel hoses; one end of each of the plurality of parallel hoses is connected to the first main water pipe; the opposite end thereof enters a respective liquid-cooled module of a plurality of liquid-cooled modules, each of the plurality of liquid-cooled modules is connected to the second main water pipe via another hose; cooling medium flows through the respective hose and the respective liquid-cooled module and the respective another hose, and then cools down the respective computing power module.

4. The liquid-cooled integrated cabinet of claim 3, wherein the first main water pipe and the second main water pipe are both vertically arranged; lower ends thereof are arc-shaped; the first main water pipe and the second main water pipe are connected with a drain valve respectively; each drain valve extends horizontally toward the front end of the main body, and an upper connecting port of the first main water pipe and an upper connecting port of the second main water pipe are arranged horizontally.

5. The liquid-cooled integrated cabinet of claim 4, wherein a plurality of the hoses are connected in parallel with the first main water pipe, and the hoses are arranged in parallel up and down; a first valve for controlling on-off of a respective hose of the plurality of hoses is provided between the respective hose of the plurality of hoses and the first main water pipe; a second valve for controlling on-off of the respective another hose is provided between the respective another hose and the second main water pipe, and each respective hose of the plurality of hoses is connected with the respective liquid-cooled module through a quick-plug connector.

6. The liquid-cooled integrated cabinet of claim 5, wherein each hose of the plurality of hoses extends from the first main water pipe to a direction away from the main body, and then enters a respective liquid-cooled module of the plurality of liquid-cooled modules after forming a first arch, and the cooling fans are arranged in the area of the first arches; each another hose of the plurality of another hoses connected between the respective liquid-cooled module of the plurality of liquid-cooled modules and the second main water pipe forms a second arch; the first valve is at the position of a straight line section of the first arch, and the second valve is at the position of a straight line section of the second arch; and one of the first main water pipe and the second main water pipe is used as a water inlet pipe, and the other thereof is used as a water outlet pipe.

7. The liquid-cooled integrated cabinet of claim 5, wherein the structure of the first valve is the same as that of the second valve; an upper end of the first valve is provided with a driving handle, and the driving handle is a fan-type structure and comprises four vertical and uniformly arranged L-shaped sheet metals.

8. The liquid-cooled integrated cabinet of claim 1, wherein the material of the hose comprises but is not limited to the following: hydrogenated nitrile rubber, low temperature resistant fluoro rubber, low phenyl silicone rubber, silicone rubber, fluorosilicone rubber, FEP tube, EPA tube, Teflon tube or Nylon tube.

9. The liquid-cooled integrated cabinet of claim 3, wherein the inner diameter of the first main water pipe is the same as that of the second main water pipe, and the inner diameter of each of the plurality of parallel hoses is less than ⅓ of the inner diameter of the first main water pipe.

10. The liquid-cooled container equipment of claim 1, wherein the main body is an assembled frame structure.

\* \* \* \* \*